(12) United States Patent
Lu et al.

(10) Patent No.: US 9,437,604 B2
(45) Date of Patent: Sep. 6, 2016

(54) METHODS AND APPARATUSES HAVING STRINGS OF MEMORY CELLS INCLUDING A METAL SOURCE

(71) Applicant: Micron Technology, Inc., Boise, ID (US)

(72) Inventors: Zhenyu Lu, Boise, ID (US); Roger W. Lindsay, Boise, ID (US); Andrew Bicksler, Nampa, ID (US); Yongjun J Hu, Boise, ID (US); Haitao Liu, Boise (ID)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/069,553

(22) Filed: Nov. 1, 2013

(65) Prior Publication Data

US 2015/0123188 A1   May 7, 2015

(51) Int. Cl.
*H01L 21/336* (2006.01)
*H01L 27/115* (2006.01)
*H01L 29/66* (2006.01)
*H01L 29/792* (2006.01)

(52) U.S. Cl.
CPC ... *H01L 27/11556* (2013.01); *H01L 29/66825* (2013.01); *H01L 29/7926* (2013.01)

(58) Field of Classification Search
CPC .................. H01L 27/11556; H01L 29/7926; H01L 29/66825
USPC .......................................... 257/321; 438/258
See application file for complete search history.

(56) References Cited

U.S. PATENT DOCUMENTS

| 2006/0258091 | A1* | 11/2006 | DeLoach | H01L 21/28052 438/257 |
| 2009/0096010 | A1 | 4/2009 | Hyun | |
| 2011/0002178 | A1* | 1/2011 | Hwang | H01L 27/11578 365/189.011 |
| 2011/0024818 | A1* | 2/2011 | Ahn | H01L 21/28273 257/314 |
| 2011/0073866 | A1* | 3/2011 | Kim | H01L 27/11582 257/69 |
| 2011/0147823 | A1* | 6/2011 | Kuk | H01L 27/11551 257/324 |

(Continued)

FOREIGN PATENT DOCUMENTS

| JP | 2009158529 A | 7/2009 |
| JP | 2013153382 A | 8/2013 |

(Continued)

OTHER PUBLICATIONS

"U.S. Appl. No. 14/069,574, Restriction Requirement mailed Feb. 5, 2015", 10 pgs.

(Continued)

*Primary Examiner* — Vongsavanh Sengdara
(74) *Attorney, Agent, or Firm* — Schwegman Lundberg & Woessner, P.A.

(57) ABSTRACT

Methods for forming a string of memory cells, an apparatus having a string of memory cells, and a system are disclosed. A method for forming the string of memory cells comprises forming a metal silicide source material over a substrate. The metal silicide source material is doped. A vertical string of memory cells is formed over the metal silicide source material. A semiconductor material is formed vertically and adjacent to the vertical string of memory cells and coupled to the metal silicide source material.

19 Claims, 6 Drawing Sheets

(56) References Cited

U.S. PATENT DOCUMENTS

| | | | | |
|---|---|---|---|---|
| 2011/0248327 | A1* | 10/2011 | Son | H01L 27/11551 257/315 |
| 2012/0001249 | A1* | 1/2012 | Alsmeier | H01L 27/11551 257/319 |
| 2012/0077320 | A1* | 3/2012 | Shim | H01L 27/11582 438/269 |
| 2012/0231593 | A1 | 9/2012 | Joo et al. | |
| 2012/0256247 | A1* | 10/2012 | Alsmeier | H01L 21/764 257/319 |
| 2013/0089974 | A1* | 4/2013 | Lee | H01L 27/11556 438/510 |
| 2013/0270625 | A1 | 10/2013 | Jang et al. | |
| 2013/0307053 | A1 | 11/2013 | Polishchuk et al. | |
| 2014/0231954 | A1* | 8/2014 | Lue | H01L 27/11524 257/528 |
| 2014/0264353 | A1* | 9/2014 | Lai | H01L 21/02595 257/66 |
| 2014/0334230 | A1 | 11/2014 | Kwon, II | |
| 2015/0123189 | A1 | 5/2015 | Sun et al. | |

FOREIGN PATENT DOCUMENTS

| | | |
|---|---|---|
| JP | 2013219239 A | 10/2013 |
| WO | WO-2015066447 A1 | 5/2015 |
| WO | WO-2015066463 A1 | 5/2015 |

OTHER PUBLICATIONS

"International Application Serial No. PCT/US2014/063377, International Search Report mailed Jan. 23, 2015", 3 pgs.

"International Application Serial No. PCT/US2014/063377, Written Opinion mailed Jan. 23, 2015", 6 pgs.

"International Application Serial No. PCT/US2014/063407, International Search Report mailed Jan. 29, 2015", 3 pgs.

"International Application Serial No. PCT/US2014/063407, Written Opinion mailed Jan. 29, 2015", 10 pgs.

\* cited by examiner

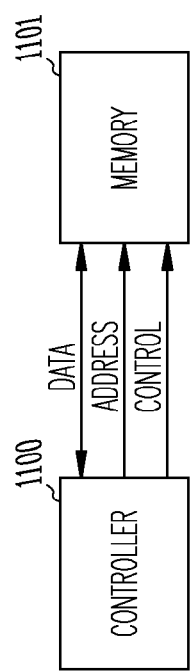
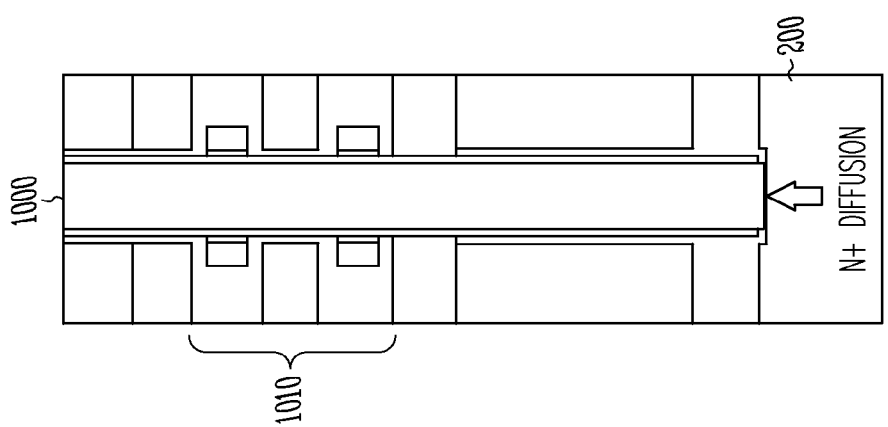

US 9,437,604 B2

METHODS AND APPARATUSES HAVING STRINGS OF MEMORY CELLS INCLUDING A METAL SOURCE

TECHNICAL FIELD

The present embodiments relate generally to memory and metal sources in memory.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and non-volatile (e.g., flash) memory.

Flash memory devices typically use a one-transistor memory cell that may allow for high memory densities, high reliability, and low power consumption. Changes in threshold voltage of the memory cells, through programming of a charge storage structure such as floating gates, trapping layers or other physical phenomena, may determine the data state of each cell.

The memory cells may be arranged in strings of memory cells where each string may be coupled to a source. Groups of strings of memory cells (e.g., memory blocks) may all be coupled to a common source.

When a memory manufacturer desires to increase a memory density of a memory device, additional groups of strings of memory cells may be added to the memory device and coupled to the common source. Thus, the common source may be increased in length, thereby increasing its resistance.

It may be desirable to keep the resistance of the source as low as possible since, as is known in the art, a larger resistance may cause a larger voltage drop from a particular point of the circuit to the common source. A larger voltage drop can cause problems during memory operations that rely on very small voltage differences.

BRIEF DESCRIPTION OF THE DRAWINGS

FIGS. 2-10 illustrate embodiments of fabrication steps for forming vertical strings of memory cells.

FIG. 11 illustrates a block diagram of an embodiment of a system.

DETAILED DESCRIPTION

Figure 1:
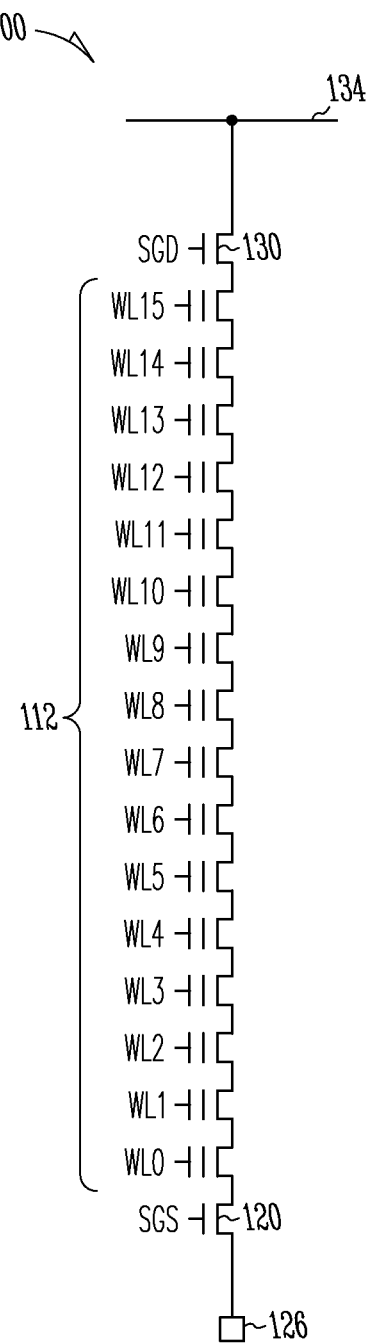
FIG. 1 illustrates a schematic diagram of an embodiment of a string of memory cells.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of a string 100 of memory cells. For purposes of illustration only, the string 100 is shown having 16 memory cells 112. Alternate embodiments can include more or less than 16 memory cells 112. The string 100 can include a source select gate transistor 120 that may include an n-channel transistor coupled between one of the memory cells 112 at one end of the string 100 and a common source 126. The common source 126 may comprise, for example, a slot of commonly doped semiconductor material and/or other conductive material. At the other end of the string 100, a drain select gate transistor 130 may include an n-channel transistor coupled between one of the memory cells 112 and a data line (e.g., bit line) 134.

Each of the memory cells 112 may comprise, for example, a floating gate transistor or, alternatively, a charge trap transistor and may include a single level charge storage device or a multilevel charge storage device. The memory cells 112, the source select gate transistor 120, and the drain select gate transistor 130 are controlled by signals on their respective control gates, the signals being provided on access lines (e.g., word lines) WL0-WL15. In one embodiment, the control gates of memory cells in a row of memory cells can form part of an access line.

The source select gate transistor 120 receives a control signal that controls the source select gate transistor 120 to substantially control conduction between the string 100 and the common source 126. The drain select gate transistor 130 receives a control signal that controls the drain select gate transistor 130, so that the drain select gate transistor 130 can be used to select or deselect the string 100.

The string 100 can be one of multiple strings of memory cells 112 in a block of memory cells in a memory device, such as a NAND-architecture flash memory device. Each string 100 of memory cells 112 may be formed vertically such that they extend outward from a substrate as opposed to a planar manner along the substrate.

Figure 2:
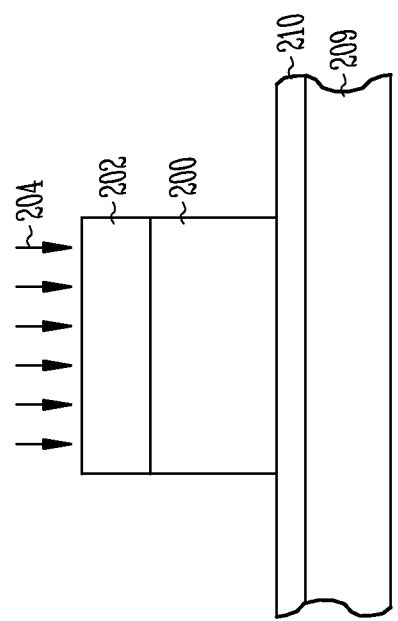

FIG. 2 illustrates embodiments of fabrication steps for forming a vertical string of memory cells. A source material 200 (e.g., metal silicide) may be formed over a substrate 209 (e.g., silicon) to act as a metal source material. An oxide or polysilicon material 210 may be formed between the substrate 209 and the source material 200.

The source material 200 may include tungsten silicide ($WSi_x$) or some other type of high temperature refractory metal silicides. For example, the metal silicide may include one of: tungsten silicide ($WSi_x$), tantalum silicide ($TaSi_x$), or molybdenum silicide ($MoSi_x$). A metal silicide may work better as a doped source metal since metal silicide may take doping better than a pure metal material. The silicide can be deposited by physical vapor deposition (PVD), wet deposition (WD), or an evaporation process. "x" ratio range can be 1.0 to 4.0.

A capping material 202 may be formed over the source material 200. The capping material 202 may include an oxide material (e.g., an oxide of silicon), a polysilicon material, or some other capping material for sealing pores in the source material 200. If the capping material 202 is an oxide (e.g., an oxide of silicon), the oxide may be used as a source select gate oxide for a source select gate transistor, such as the source select gate transistor 120 as illustrated in FIG. 1.

The source material 200 in FIG. 2 can be doped in a doping process 204 (e.g., an implantation process) in order to alter its electrical properties as desired. For example, arsenic or phosphorus may be used in doping process 204 to dope the metal material to create an n-type conductive material. Boron or gallium may be used in doping process 204 to dope the source material 200 to create a p-type conductive material.

Figure 3:
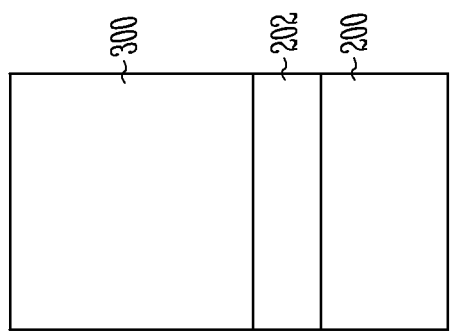

FIG. 3 illustrates an embodiment of another fabrication step for forming a vertical string of memory cells. A polysilicon material 300 may be formed over the capping material 202. In an embodiment, the polysilicon material 300 may be used as a gate of a source select gate transistor, such as source select gate transistor 120 as illustrated in FIG. 1.

Figure 4:
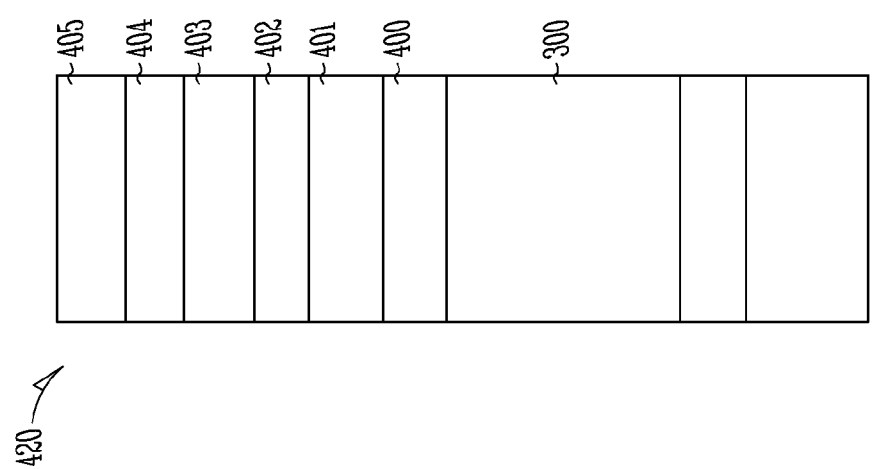

FIG. 4 illustrates an embodiment of a series of fabrication steps for forming a vertical string of memory cells. An etch stop material 400 may be formed over the polysilicon material 300. In an embodiment, the etch stop material 400 may include a metal oxide such as aluminum oxide ($Al_2O_3$).

Levels of control gate material 401, 403 may be formed over the etch stop material 400 with alternating levels of insulator material 402, 404. For example, the levels of control gate material 401, 403 may include a polysilicon material and the levels of insulator material 402, 404 may include an oxide material. The levels of control gate material 401, 403 may be used as the control gates of the vertically formed memory cells. The levels of insulator material 402, 404 may be used between the memory cells to isolate adjacent memory cells from each other.

An etch mask 405 may be formed over the top of the vertical stack 420. In an embodiment, the etch mask 405 may include a nitride hard mask.

Figure 5:
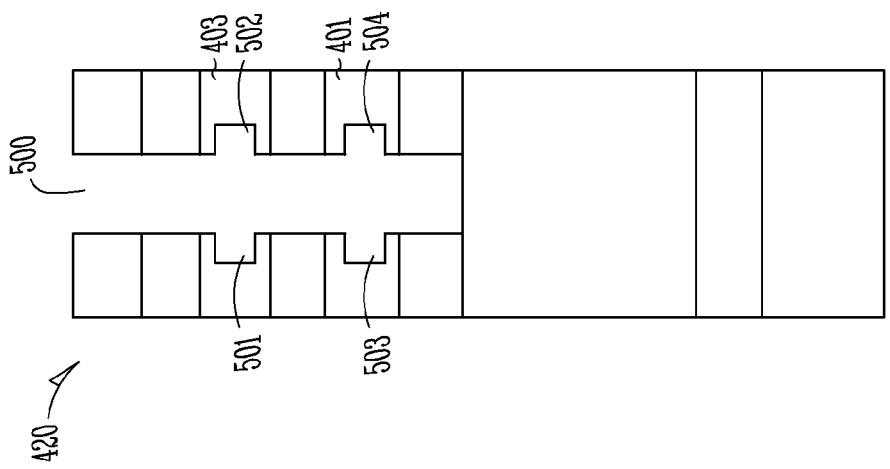

FIG. 5 illustrates an embodiment of a series of additional fabrication steps for forming a vertical string of memory cells. An etching step may be used to form an opening 500, such as a contact hole or a trench, in the vertical stack 420 down through the etch stop material 400. A directional etch process may be used to form recesses 501-504 into the levels of control gate material 401, 403 on both sides of the walls of the opening.

Figure 6:
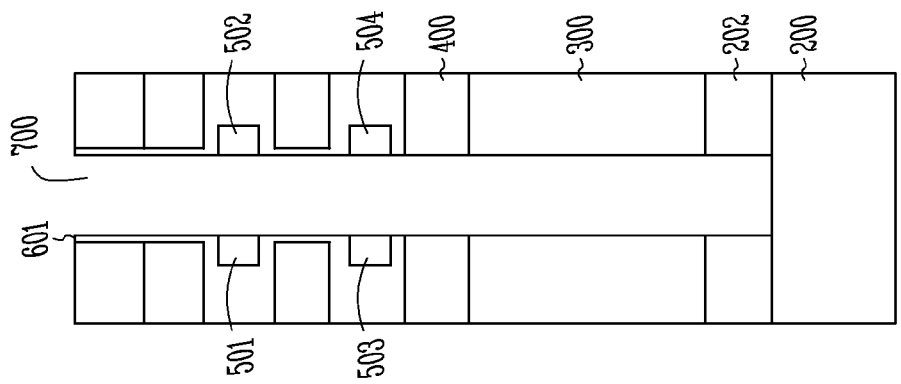

FIG. 6 illustrates an embodiment of a series of additional fabrication steps for forming a vertical string of memory cells. A dielectric material (e.g., oxide-nitride-oxide (ONO)) 600 may be formed along the interior walls of the opening 500. The ONO material 600 may also line the walls of the recesses 501-504. In an embodiment, the ONO material 600 may be used as a dielectric material for the string of memory cells.

A polysilicon material 601 may be formed (e.g., deposited) over the ONO material 600 along the sidewalls of the opening 500. The polysilicon material 601 may also fill the recesses 501-504. In an embodiment, the polysilicon material 601 may be used as the charge storage structures (e.g., floating gates) for each memory cell in the string of memory cells.

Figure 7:
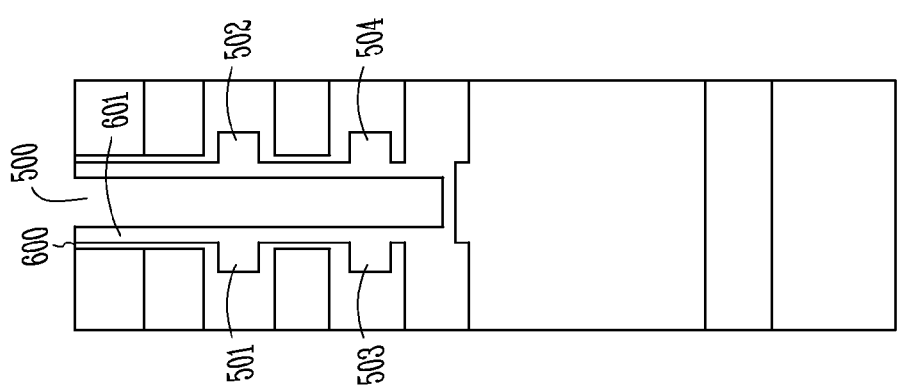

As shown in FIG. 7, a post polysilicon etch process may be used to remove part of polysilicon 601 along the sidewalls and to form an opening (e.g., a trench or contact hole) 700 through the previously formed materials 202, 300, 400. The opening 700 may be formed down to the source material 200. After a portion of the polysilicon material 601 lining the sidewalls of the opening 700 is removed, a remaining portion of the polysilicon material 601 that fills the recesses 501-504 may act as the charge storage structures (e.g., floating gates) of the memory cells. Since etching through so much material 202, 300, 400 may use a powerful etching process, the metal material 200 may act as a better etch stop material than a polysilicon material.

Figure 8:
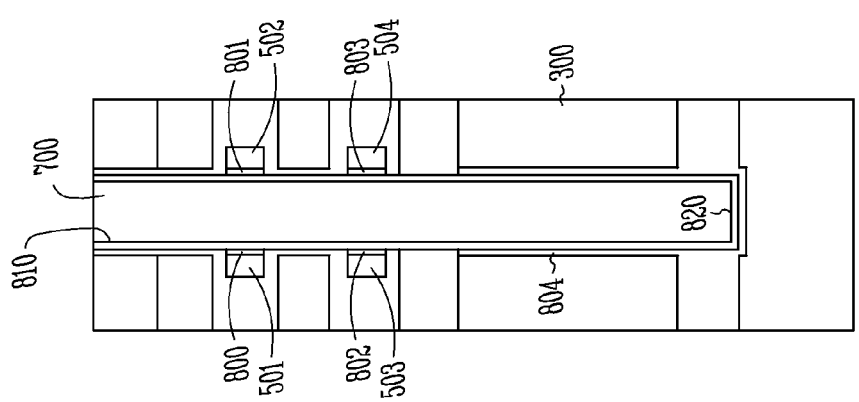

FIG. 8 illustrates an embodiment of a series of additional fabrication steps for forming a vertical string of memory cells. An oxide 800-804 may be formed (e.g., grown) along areas of the opening 700. For example, an oxide 800-803 may be formed over each polysilicon material in each recess 501-504. In an embodiment, this oxide 800-803 may act as a tunnel dielectric between the charge storage structure and the channel material to be formed subsequently (e.g., formed after oxide 800-804 are formed).

An oxide 804 may be formed (e.g., grown) along the sidewalls and bottom 820 of a bottom portion of the opening 700. In an embodiment, this oxide 804 may act as a dielectric for the polysilicon material 300 of the source select gate.

A polysilicon liner 810 may be formed along the sidewalls and bottom 820 of the opening 700. The polysilicon liner 810 may be formed over the previously formed oxide 800-804 (e.g., formed after oxide 800-804 are formed).

Figure 9:
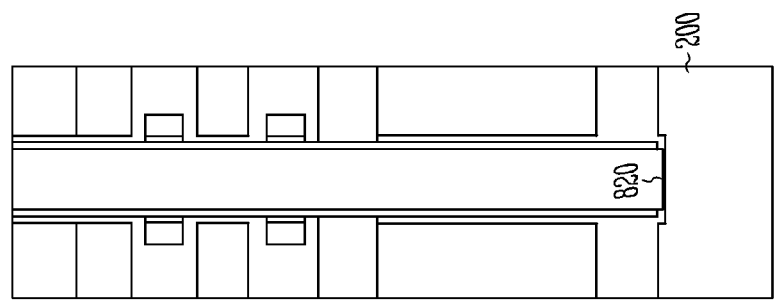

FIG. 9 illustrates an embodiment of another fabrication step for forming a vertical string of memory cells. A directional etch process may be used to remove a portion of the polysilicon liner 810 and a portion of oxide 804 formed at the bottom 820 of the opening 700. This step may give the subsequently formed channel material an ohmic contact with the source material 200.

FIG. 10 illustrates an embodiment of another fabrication step for forming a vertical string of memory cells. A semiconductor material (e.g., polysilicon) 1000 may be used to fill the opening. In an embodiment, the semiconductor material 1000 may be used as a channel during operation of the vertical string of memory cells 1010 formed in the opening. In an embodiment, the ohmic contact of the semiconductor material 1000 to the source material 200 enables diffusion (e.g., N+ diffusion) to occur from the source material 200 to the channel (e.g., semiconductor material 1000) during operation.

FIG. 11 illustrates an embodiment of a system that may use the vertically formed strings of memory cells of FIGS. 1-10. A controller 1100 may be used to control operations of the system. A memory 1101, coupled to the controller 1100, may include the vertically formed strings of memory cells. In an embodiment, the controller 1100 may be coupled to the memory 1101 over control, data, and address buses. In another embodiment, the address and data buses may share a common I/O bus.

An apparatus may be defined as circuitry, an integrated circuit die, a device, or a system.

CONCLUSION

One or more embodiments can provide a doped metal silicide source. The doped metal silicide source may provide lower sheet resistance than a polysilicon source and also provide adequate gate induced drain leakage performance. A vertical string of memory cells may be formed over the doped metal silicide source and a semiconductor material formed vertically adjacent to the vertical string of memory cells. The semiconductor material may be in contact with the doped metal silicide source to enable diffusion from the source to the semiconductor material that acts as a channel for the string of memory cells.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:
1. A method comprising:
 forming a metal silicide source layer over and in contact with a substrate;
 doping the metal silicide source layer;

forming a capping material on the doped metal silicide source layer;

forming a select gate material on the capping material; and forming a vertical string of floating gate memory cells on the select gate material and extending vertically from the doped metal silicide source layer after forming the metal silicide source layer over the substrate, the vertical string of memory cells including a pillar of semiconductor channel material formed on and extending vertically from and in contact with the doped metal silicide source layer at an ohmic contact, wherein the pillar of semiconductor channel material is not doped.

2. The method of claim 1 wherein forming the string of memory cells comprises:

forming alternating levels of control gate material and insulator material over the select gate material;

forming an opening through the alternating levels of control gate material and insulator material, the select gate material, and the capping material, the opening comprising recesses formed on sidewalls of the opening in the control gate material;

forming a dielectric material over the recesses and the sidewalls of the opening of the alternating levels of control gate material and insulator material;

forming charge storage structures in the recesses;

forming a tunnel dielectric material over the charge storage structures and the sidewalls of the opening of the select gate material; and forming the channel material in the opening such that the channel material contacts the doped metal silicide source layer.

3. The method of claim 2 and further comprising forming a nitride hard mask over the alternating levels of control gate material and insulator material.

4. The method of claim 2 wherein the dielectric material comprises an oxide-nitride-oxide (ONO) material.

5. The method of claim 2 wherein the tunnel dielectric material and the insulator material comprise an oxide material.

6. The method of claim 2 wherein the select gate material, the control gate material, the charge storage structures, and the channel material comprise a polysilicon.

7. The method of claim 2 and further comprising forming an etch stop material between the select gate material and the alternating levels of control gate material and insulator material.

8. The method of claim 1 and further comprising forming an oxide between the substrate and the doped metal silicide source layer.

9. The method of claim 1 and further comprising forming a polysilicon material between the substrate and the doped metal silicide source layer.

10. The method of claim 1 wherein the metal silicide source layer is one of: tungsten silicide ($WSi_x$), tantalum silicide ($TaSi_x$), molybdenum silicide ($MoSi_x$), or refractory metal silicides.

11. The method of claim 10 wherein "x" ratio is in a range of 1.0 to 4.0.

12. The method of claim 1 wherein the capping material comprises one of an oxide or a polysilicon material.

13. A method comprising:

forming metal silicide source material onto a substrate;

forming an oxide material over the metal silicide source material;

doping the metal silicide source material;

forming a polysilicon select gate material over the oxide material; and forming a string of floating gate memory cells over the polysilicon select gate material, the string of floating gate memory cells including undoped semiconductor channel material that extends through the polysilicon select gate material and the oxide material to contact the doped metal silicide source material.

14. The method of claim 13 wherein doping the metal silicide source material comprises doping the metal silicide source material with one of arsenic, boron, phosphorus, or gallium.

15. The method of claim 13 wherein doping the metal silicide source material comprises one of: doping the metal silicide material with arsenic or phosphorus to an n-type conductive material or doping the metal silicide source material with boron or gallium to create a p-type conductive material.

16. A method comprising:

forming metal silicide source material onto a substrate;

forming a capping material over the metal silicide source material;

doping the metal silicide source material;

forming a select gate material over the capping material; and forming a vertical string of floating gate memory cells over the select gate material, in a plurality of alternating levels of control gate material and insulator material, wherein forming the vertical string of memory cells comprises forming a vertical undoped semiconductor material coupled to the doped metal silicide source material and adjacent to the select gate material, wherein the floating gates of the vertical string of memory cells and the select gate material are insulated from the vertical undoped semiconductor material by a tunnel dielectric material.

17. The method of claim 16 wherein forming the vertical string of memory cells comprises:

forming a recess in each level of control gate material;

lining the recess with a dielectric material; and filling the lined recess with a floating gate material.

18. The method of claim 16 wherein the insulator material and the tunnel dielectric material comprise an oxide material.

19. The method of claim 16 wherein forming the vertical undoped semiconductor material coupled to the doped metal silicide source material comprises forming an ohmic contact between the vertical undoped semiconductor material and the doped metal silicide source material.

* * * * *